(12) United States Patent
Ito et al.

(10) Patent No.: US 10,386,717 B2
(45) Date of Patent: Aug. 20, 2019

(54) IMPRINT METHOD AND APPARATUS

(71) Applicant: CANON KABUSHIKI KAISHA, Tokyo (JP)

(72) Inventors: Toshiki Ito, Kawasaki (JP); Takashi Yoshida, Utsunomiya (JP); Hitoshi Sato, Utsunomiya (JP); Youji Kawasaki, Utsunomiya (JP); Akiko Iimura, Utsunomiya (JP); Keiji Yamashita, Utsunomiya (JP); Takehiko Ueno, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 212 days.

(21) Appl. No.: 14/900,126

(22) PCT Filed: Jun. 18, 2014

(86) PCT No.: PCT/JP2014/066753
§ 371 (c)(1),
(2) Date: Dec. 18, 2015

(87) PCT Pub. No.: WO2014/208571
PCT Pub. Date: Dec. 31, 2014

(65) Prior Publication Data
US 2016/0147143 A1    May 26, 2016

(30) Foreign Application Priority Data

Jun. 26, 2013  (JP) ................................. 2013-133541
Jun. 12, 2014  (JP) ................................. 2014-121911

(51) Int. Cl.
*B29C 59/02*      (2006.01)
*G03F 7/00*       (2006.01)
(Continued)

(52) U.S. Cl.
CPC .......... *G03F 7/0002* (2013.01); *B29C 59/002* (2013.01); *B29C 59/005* (2013.01);
(Continued)

(58) Field of Classification Search
CPC ... G03F 7/0002; B29C 59/026; B29C 59/005; B29C 59/002; B29C 59/022
See application file for complete search history.

(56) References Cited

U.S. PATENT DOCUMENTS

2004/0059013 A1    3/2004  Tanabe
2008/0131791 A1*   6/2008  Cho ........................ B82Y 10/00
                                                              430/5
(Continued)

FOREIGN PATENT DOCUMENTS

CN        1208056 A       2/1999
CN      105009256 A      10/2015
(Continued)

OTHER PUBLICATIONS

Youn et al., "Control of Resin Filling and Pattern Quality of Ultraviolet Nanoimprint Lithography in Pentafluoropropane and Helium Ambient", Journal of Applied Physics 52 (2013) 06GJ07 (Year: 2013).*

(Continued)

*Primary Examiner* — Galen H Hauth
(74) *Attorney, Agent, or Firm* — Canon U.S.A., Inc. IP Division

(57) ABSTRACT

An imprint method includes: placing a light-curable composition on a workpiece substrate (placement); bringing the light-curable composition and a mold into contact with each other an atmosphere of a condensable gas (contact); aligning the mold and the workpiece substrate (alignment); irradiating the light-curable composition with light to obtain a light-cured composition (irradiation); and separating the (Continued)

light-cured composition and the mold from each other after the irradiation (release). The film thickness of the light-curable composition during the alignment is 20% or more greater than that of the light-cured composition after the release.

11 Claims, 4 Drawing Sheets

(51) Int. Cl.
  *B29C 59/00*    (2006.01)
  *B29K 33/00*    (2006.01)
  *B29K 105/00*    (2006.01)

(52) U.S. Cl.
  CPC .......... *B29C 59/022* (2013.01); *B29C 59/026* (2013.01); *B29K 2033/08* (2013.01); *B29K 2105/0005* (2013.01)

(56) References Cited

U.S. PATENT DOCUMENTS

| | | | |
|---|---|---|---|
| 2009/0115110 A1 | 5/2009 | Schumaker | |
| 2010/0123886 A1* | 5/2010 | Bijnen | G03F 9/7003 355/53 |
| 2012/0199997 A1* | 8/2012 | Tanabe | B82Y 10/00 264/82 |
| 2012/0306122 A1 | 12/2012 | Hoshino | |
| 2013/0032971 A1* | 2/2013 | Omatsu | B82Y 10/00 264/293 |
| 2013/0052431 A1 | 2/2013 | Enomoto | |
| 2013/0099423 A1 | 4/2013 | Umekawa | |
| 2014/0239529 A1* | 8/2014 | Tan | G03F 7/0002 264/40.5 |
| 2014/0349086 A1 | 11/2014 | Ito et al. | |

FOREIGN PATENT DOCUMENTS

| | | |
|---|---|---|
| JP | H01229024 A | 9/1989 |
| JP | 3700001 B2 | 9/2005 |
| JP | 2007-144995 A | 6/2007 |
| JP | 2011096766 A | 5/2011 |
| JP | 2011171364 A | 9/2011 |
| JP | 2012-109551 A | 6/2012 |
| JP | 2012164785 A | 8/2012 |
| JP | 2013070033 A | 4/2013 |
| JP | 2013168645 A | 8/2013 |
| JP | 2014033082 A | 2/2014 |
| KR | 10-2009-0027169 A | 3/2009 |
| KR | 10-2012-0034105 A | 4/2012 |
| WO | 2013/008940 A1 | 1/2013 |
| WO | 2013035761 A1 | 3/2013 |
| WO | 2013/069511 A1 | 5/2013 |
| WO | 2014/046304 A1 | 3/2014 |
| WO | 2014/084395 A1 | 6/2014 |

OTHER PUBLICATIONS

Hiroshi Hiroshima, "Quick Cavity Filing in UV Nanoimprint Using Pentafluoropropane", Japanese Journal of Applied Physics, 2008, pp. 5151-5155, vol. 47, No. 6.
U.S. Appl. No. 14/900,116, filed Dec. 18, 2015, Takeshi Honma.
U.S. Appl. No. 14/900,593, filed Dec. 21, 2015, Shiori Yonezawa.
Qing Wang, et al., "Effects of Environmental Gas in UV Nanoimprint on the Characteristics of UV-Curable Resin", Japanese Journal of Applied Physics, vol. 49, 2010, pp. 06GL04 1-06GL04 4.
Shu Kaneko, et al., "Morphological Changes in Ultraviolet-Nanoimprinted Resin Patterns Caused by Ultraviolet-Curable Resins Absorbing Pentafluoropropane", Japanese Journal of Applied Physics, vol. 51, 2012, pp. 06FJ05 1-06FJ05 6.

* cited by examiner

IMPRINT METHOD AND APPARATUS

TECHNICAL FIELD

The present invention relates to imprint lithography and to an imprint method in which a gas is allowed to flow around an imprint layer.

BACKGROUND ART

Imprint is a known lithographic technique for producing electronic devices (such as semiconductor IC devices and liquid-crystal display devices). In an imprint method, a light-curable composition on a workpiece substrate, such as a wafer or a glass plate, and a fine-patterned mold are brought into contact with each other, and the light-curable composition is cured while in contact with the mold so that the pattern will be transferred to the workpiece substrate.

Imprint apparatus usually aligns a mold and a workpiece substrate by die-by-die alignment. Die-by-die alignment is a mode of alignment in which alignment marks, provided in the individual shot regions defined on the workpiece substrate, are optically detected and used to correct the positional displacement of the mold and the workpiece substrate with respect to each other.

PTL 1 describes a technology in which imprinting that includes transferring a shape on a mold to a resist is carried out in an atmosphere of a gas that condenses at the imprint temperature and pressure so that accurate imprint can be done even under atmospheric pressure.

CITATION LIST

Patent Literature

PTL 1 Japanese Patent No. 3700001

Non Patent Literature

NPL 1 *Japanese Journal of Applied Physics*, Vol. 51, 2012, 06FJ05

An imprint method may include minimizing the film thickness of the light-curable composition on the workpiece substrate so that in-plane variations between shot regions can be reduced and the pattern can be transferred with enhanced accuracy (resolution).

The method described in PTL 1, however, requires great force to move the light-curable composition and the mold apart from each other in the shear direction after contact when the film thickness of the light-curable composition on the substrate is small, in particular, 20 nm or less.

The great shear stress applied during die-by-die alignment induces large strains in the mold and the workpiece substrate, making it difficult to accurately align the mold and the substrate and increasing the time spent on alignment.

SUMMARY OF INVENTION

An aspect of the invention provides an imprint method that includes dissolving a condensable gas in a light-curable composition to make the film thickness of the light-curable composition during alignment 20% or more greater than that of the resulting light-curable composition so that the force required to displace the light-curable composition with respect to the mold in the shear direction after the contact of them can be reduced.

An aspect of the invention therefore provides an imprint method that includes: placing a light-curable composition on a workpiece substrate (placement); bringing the light-curable composition and a mold into contact with each other in an atmosphere of a condensable gas (contact); aligning the mold and the workpiece substrate (alignment); irradiating the light-curable composition with light to form a light-cured composition (irradiation); and separating the light-cured composition and the mold from each other after the irradiation (release). The condensable gas is a gas that condenses under the temperature condition that occurs during the contact and the pressure condition that occurs while the light-curable composition penetrates into the space between the workpiece substrate and the mold or a depression created in the mold. The film thickness of the light-curable composition during the alignment is 20% or more greater than that of the light-cured composition after the release.

Further features of the present invention will become apparent from the following description of exemplary embodiments with reference to the attached drawings.

DESCRIPTION OF EMBODIMENTS

Figure 1:
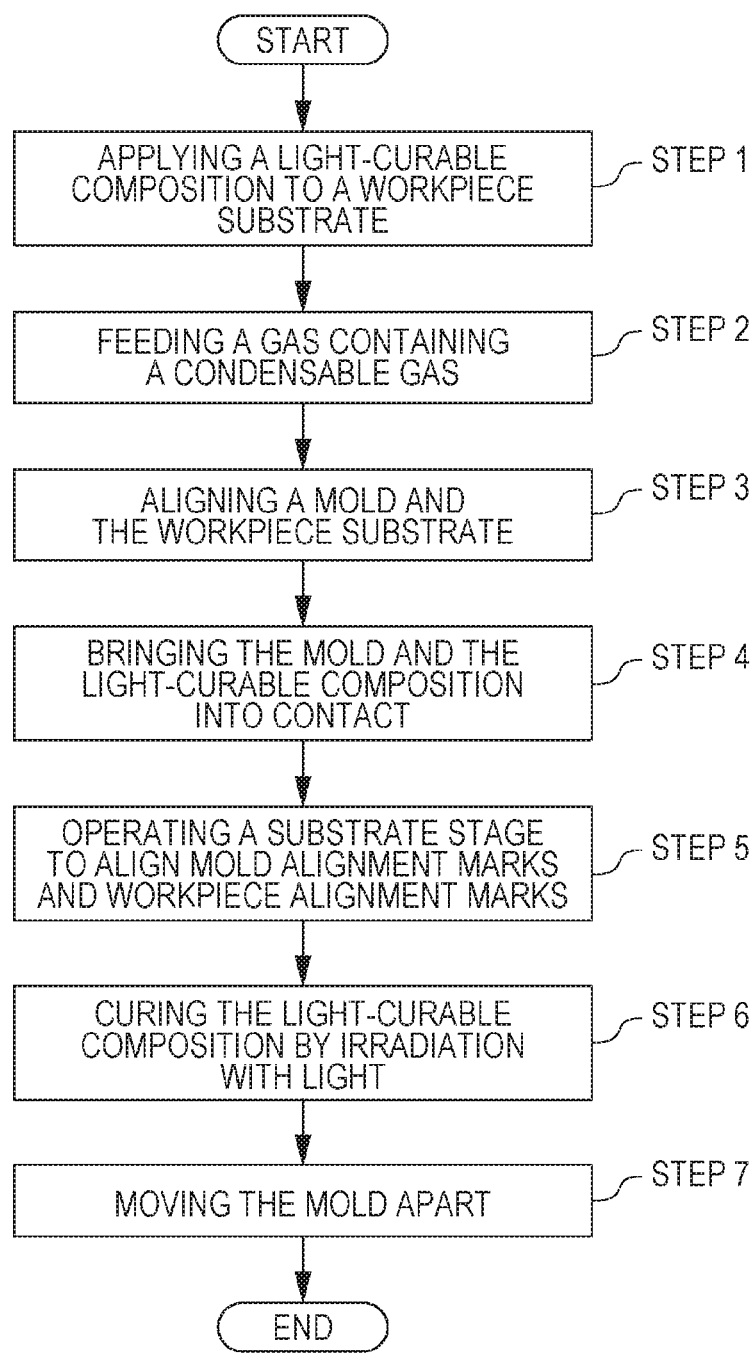
FIG. 1 is a flow diagram of an imprint method according to an aspect of the invention.

An embodiment of the invention is an imprint method that includes alignment, i.e., aligning a workpiece substrate and a mold in an atmosphere of a condensable gas. The alignment follows contact, i.e., bringing a light-curable composition and a mold into contact with each other, and the film thickness of the light-curable composition during the alignment is 20% or more greater than that of a light-cured composition after the release.

Possible reasons for the large film thickness of the light-curable composition during the alignment include, but are not limited to, the dissolution of the condensable gas. For example, NPL 1 mentions that a condensable gas dissolves in light-curable compositions.

An imprint method according to an embodiment of the invention may include dissolution, i.e., dissolving the condensable gas in the light-curable composition, before the contact. The dissolution may include adjustment for temperature and pressure conditions under which the condensable gas can easily dissolve in the light-curable composition. The dissolution may also be simply waiting until the condensable gas has dissolved.

The dissolution is an operation for helping the condensable gas to dissolve in the light-curable composition. Omitting this operation does not mean that the condensable gas does not dissolve.

The following describes certain embodiments of the invention with reference to the attached drawings. Like numbers in the drawings reference like elements, and duplicate descriptions are omitted.

In an embodiment of the invention, all operations are performed at a temperature equal to or higher than the boiling point of the condensable gas, preferably 20° C. to 25° C., more preferably 23±0.2° C.

Figure 2:
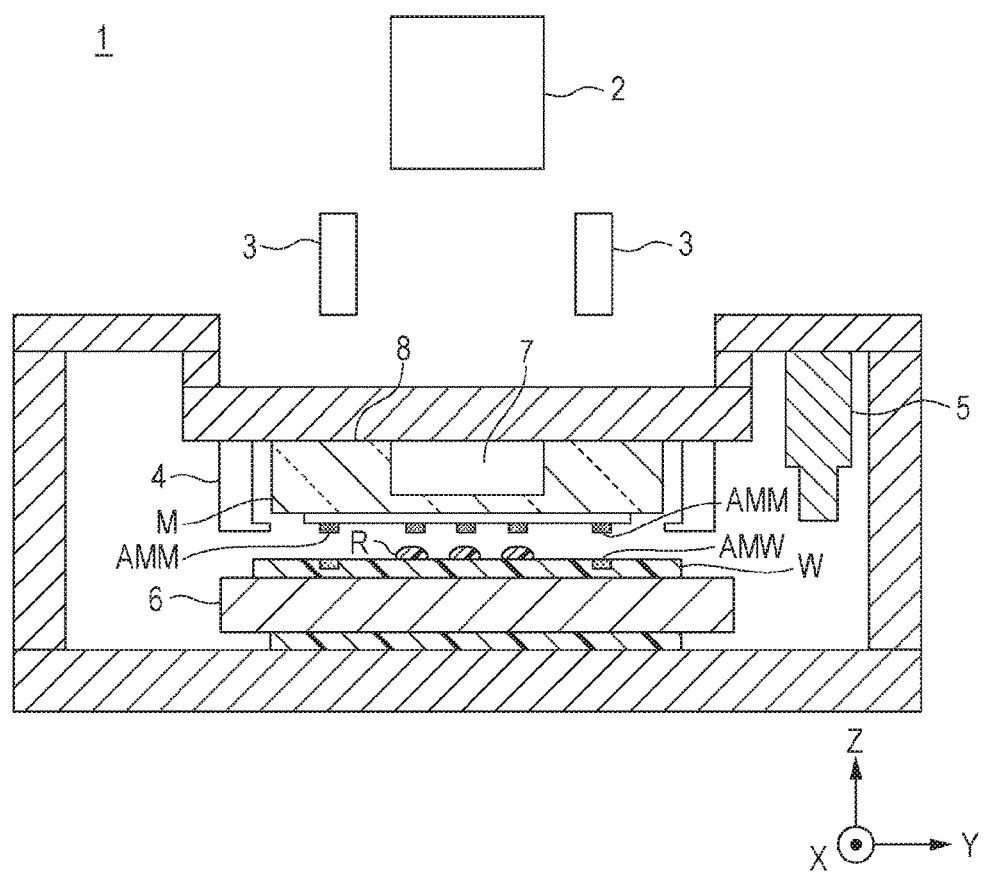
FIG. 2 is a schematic view of an imprint apparatus according to an aspect of the invention.

An imprint method according to an embodiment of the invention can be conducted with the use of an imprint apparatus illustrated in FIG. 2, for example. An imprint apparatus according to this embodiment has a gas introducer configured to introduce a condensable gas, an aligner for a mold and a workpiece substrate, and a mechanism capable of controlling the space between the mold and the workpiece substrate even when the space is 20 nm or less.

FIG. 2 is a cross-sectional schematic view of an imprint apparatus according to this embodiment. In FIG. 2, the direction perpendicular to a pattern on a mold M is the Z axis, and the two axes that orthogonally cross the Z axis are X and Y axes. Typically, the Z axis is parallel with the vertical direction.

In FIG. 2, a workpiece substrate W is on a substrate stage 6 that can be moved with respect to the mold M. The substrate stage 6 has an attracting mechanism (not illustrated) by which the stage can attract and retain the workpiece substrate W.

The form of motion of the substrate stage 6 can be one in which it can move in the X-Y plane or one in which it can additionally move in the direction of the Z axis.

The imprint apparatus 1 has an applicator 5 that applies a light-curable composition R to the workpiece substrate W so that the apparatus can apply the light-curable composition to the workpiece substrate (step 1). Examples of techniques that can be used to apply the light-curable composition include, but are not limited to, ink jet, dip coating, air-knife coating, curtain coating, wire-bar coating, gravure coating, extrusion coating, spin coating, and slit scanning. In particular, ink jet is preferred.

The light-curable composition can be applied through the movement of the workpiece substrate to the applicator or the movement of the applicator to the workpiece substrate.

An imprint apparatus according to this embodiment has a gas feeder 4 for feeding a condensable gas. The condensable gas can be fed in any operation during imprinting before the contact of the mold and the light-curable composition. For example, the condensable gas may be fed after step 1 (step 2).

The light-curable composition R on the workpiece substrate W and the fine-patterned mold M are aligned (step 3). This alignment operation is conducted with the use of alignment marks on the mold side AMM and alignment marks on the workpiece side AMW on the workpiece substrate W.

The alignment includes operating the substrate stage 6 while observing it with alignment cameras 3. The alignment can be done through the movement of the substrate stage, the movement of the mold, or the movement of both.

After the alignment, contact is performed, i.e., the mold M and the light-curable composition R are brought into contact with each other (step 4). The contact applies stress to the mold and the light-curable composition, displacing them from the positions where they are placed in the previous operation.

This displacement that occurs after the contact is corrected through alignment with the use of AMM and AMW (step 5).

Then the light-curable composition R is irradiated with light from a light source 2 while in contact with the mold, which cures the light-curable composition in a shape that conforms to the mold, yielding a light-cured composition (step 6). Through this irradiation operation the pattern is transferred to the workpiece substrate W.

The light used to cure the light-curable composition can be ultraviolet light, for example. Wavelengths of lights that can be used are not limited to this.

After the irradiation, the mold is separated from the light-curable composition (step 7). This release operation may be done in such a way that the release force, i.e., the force required to move the mold apart, can be reduced.

The film thickness of the light-curable compound during the post-contact alignment can be greater than that of the light-cured composition after the release. More specifically, the film thickness of the light-curable compound during the post-contact alignment can be 20% or more greater than that of the light-cured composition after the release.

The mold has a cavity 7 (an airspace) in the middle of the back thereof (the side opposite the patterned side), at which the mold is thinner than the surrounding portions, so that the time required to fill the mold with the light-curable composition can be shortened and that the release force can be reduced. A mold holder 8 that holds the mold has a soft component (on the side on which it holds the mold) so that the inclination of the workpiece substrate can be followed.

An imprint method according to an embodiment of the invention may include minimizing the film thickness of the light-curable composition R on the workpiece substrate W so that in-plane variations between shot regions can be reduced and the pattern can be transferred with enhanced accuracy (resolution).

An imprint apparatus according to this embodiment can be used to, for example, produce electronic devices such as semiconductor IC devices and liquid-crystal display devices.

Examples of materials that can be used as the workpiece substrate W include a silicon wafer and a glass plate. The mold M is permeable to the light emitted by the light source 2 and can be made of, for example, quartz, silicon, resin, or a combination of such materials.

The mold M according to this embodiment has a projection, and the surface of the projection has a pattern of fine irregularities (a patterned portion).

The condensable gas in this embodiment refers to a gas that exists in a gaseous form under ordinary temperature and pressure conditions in the imprint apparatus and condenses upon exposure to the temperature and pressure conditions that occur while the light-curable composition penetrates using capillary force into the space between the substrate and the mold or the depressions in the mold during the contact of the mold and the light-curable composition.

In other words, the condensable gas is a gas that condenses under the temperature condition that occurs during the contact and the pressure condition to which the condensable gas is subjected while the light-curable composition penetrates into the space between the workpiece substrate and the mold or the depressions created in the mold.

In this and other embodiments of the invention, a condensable gas is defined as a gas that has a boiling point of −10° C. to 23° C. or a vapor pressure of 0.1 to 0.4 MPa at 23° C. In particular, condensable gases that have a boiling point of 10° C. to 23° C. are preferred to other gases that fall within the above ranges.

A gas that has a vapor pressure of 0.1 to 0.4 MPa at 23° C. easily condenses into a liquid leaving no bubbles upon exposure to the capillary pressure that occurs while the light-curable composition R penetrates into the space between the substrate W and the mold M or the depressions created in the mold M.

A vapor pressure exceeding 0.4 MPa at ordinary temperature causes the antifoam effect to be insufficient. A vapor pressure lower than 0.1 MPa at ordinary temperature makes the apparatus complicated because of the necessity of depressurization.

Examples of condensable gases include chlorofluorocarbon (CFC), fluorocarbon (FC), hydrochlorofluorocarbon (HCFC), hydrofluorocarbon (HFC), and hydrofluoroether (HFE).

In particular, 1,1,1,3,3-pentafluoropropane ($CHF_2CH_2CF_3$, HFC-245fa), which has a vapor pressure of 0.14 MPa at room temperature (23° C.) and a boiling point of 15° C., trichlorofluoromethane (boiling point: 24° C.), which has a vapor pressure of 0.1056 MPa at room temperature (23° C.) and a boiling point of 24° C., and pentafluoroethyl methyl ether ($CF_3CF_2OCH_3$, HFE-245mc) are preferred.

Such condensable gases can be used alone, and it is also possible to use a combination of two or more condensable gases. Mixtures with non-condensable gases such as air, nitrogen, carbon dioxide, helium, and argon can also be used. An example of a particularly preferred non-condensable gas is helium. When a mixed gas is used, the alignment is performed in a mixed-gas atmosphere of the condensable and non-condensable gases.

A predetermined amount of such a condensable gas is fed in a gaseous form to the vicinity of the light-curable composition on the workpiece substrate at a pressure lower than its vapor pressure or a temperature higher than its boiling point.

HFC and HFE are of low reactivity and unlikely to affect other materials. The condensable gas is fed from a gas feeder 4 located near the site where imprint is performed, making contact with the light-curable composition R.

Some kinds of condensable gases may have adverse effects, such as accelerated corrosion of the materials used in the apparatus. Thus, the imprint apparatus can have a protection layer for its components on the surface thereof that is to be exposed to the condensable gas.

The following is a comparison of a case where an embodiment of the invention is used and a case where it is not used, described with reference to FIGS. 3A to 3L.

FIGS. 3A to 3F are diagrams that illustrate an imprint method according to an embodiment of the invention in which a gas that contains a condensable gas is used. FIGS. 3G to 3L are diagrams that illustrate an imprint method for comparison with that embodiment of the invention. In this method, a gas that contains no condensable gas is used.

Figure 3A:
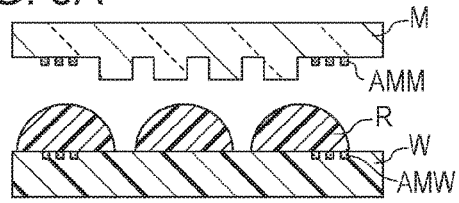
FIGS. 3A to 3L are cross-sectional schematic views of a production process according to an aspect of the invention, the process including the accuracy of the alignment of a mold and a workpiece substrate, and cross-sectional views provided for comparison purposes, these views including the accuracy of the alignment of the mold and the workpiece substrate without a condensable gas.
Figure 3G:
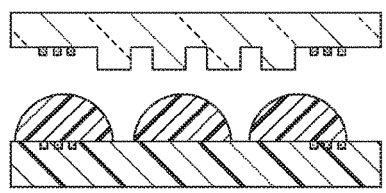

FIGS. 3A and 3G illustrate applying a light-curable composition R to a workpiece substrate W. More specifically, a substrate stage 6 in FIG. 2 moves and comes under a light-curable composition applicator 5, and the applicator 5 is used to apply the light-curable composition R to the workpiece substrate W. The light-curable composition used in this embodiment is an acrylic resin that polymerizes upon exposure to light.

Figure 3B:
Figure 3H:
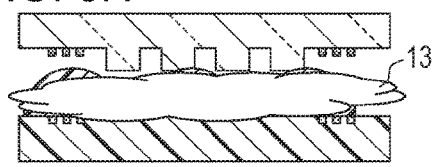

FIG. 3B illustrates feeding a condensable-gas-containing gas 9, and FIG. 3H illustrates feeding a condensable-gas-free gas 13. The condensable-gas-containing gas is a gas that condenses, whereas the condensable-gas-free gas is a gas that does not condense. Each gas is fed from a gas feeder.

The condensable gas used in this embodiment is 1,1,1,3,3-pentafluoropropane. 1,1,1,3,3-Pentafluoropropane is known to be soluble in a light-curable composition that contains an acrylic monomer as a main component, with the solubility being approximately 40% by volume (NPL 1).

1,1,1,3,3-Pentafluoropropane is a condensable gas that has a vapor pressure of 123 kPa at 20° C. and a boiling point of 15° C. During the contact and stamping, capillary pressure occurs while the light-curable composition penetrates into the space between the workpiece substrate and the mold or the depressions in the mold, condensing the gas of this compound into a liquid.

Figure 3C:
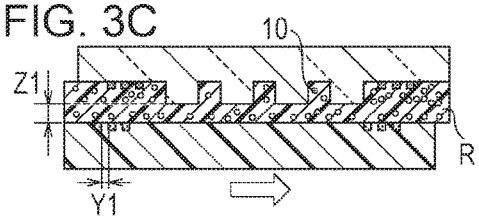
Figure 3I:
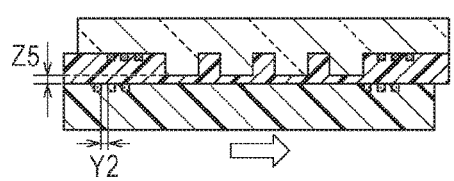

FIGS. 3C and 3I illustrate alignment, i.e., aligning the mold and the workpiece substrate with the use of alignment marks on the mold side AMM and alignment marks on the workpiece side AMW. The mold and the light-curable composition are brought into contact with each other after the alignment.

The light-curable composition in FIG. 3C, which contains a condensable gas dissolved therein, has a film thickness 40% greater than that the light-curable composition in FIG. 3I has.

As illustrated in FIG. 3C, the force applied during the contact and stamping deforms the mold M and the workpiece substrate W, making them horizontally displaced from each other with a distance of Y1 in the shear direction.

Then the substrate stage 6 is operated as in step 5 in FIG. 1. The substrate stage 6 and the workpiece substrate W are operated to reduce the amount of displacement Y1 illustrated in FIG. 3C.

Figure 3D:
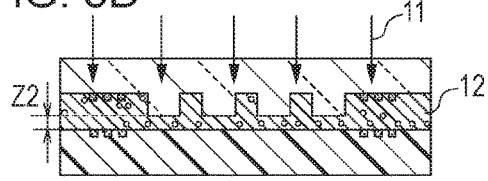
Figure 3J:
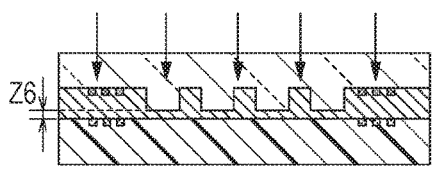

FIGS. 3D and 3J illustrate irradiation, i.e., irradiating the light-curable composition R with light 11 to obtain a light-cured material 12. A light source 2 is used to irradiate the light-curable composition R with the light 11 until it has cured. A cured form of a light-curable composition is herein referred to as a light-cured material.

Figure 3E:
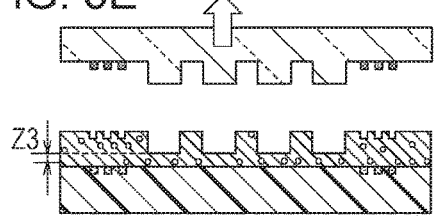
Figure 3K:
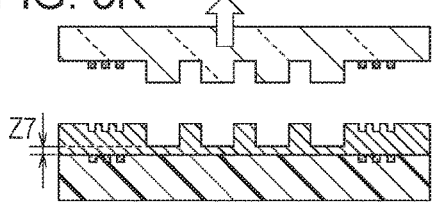

FIGS. 3E and 3K illustrate release, i.e., separating the mold M and the light-cured material 12 from each other.

Figure 3F:
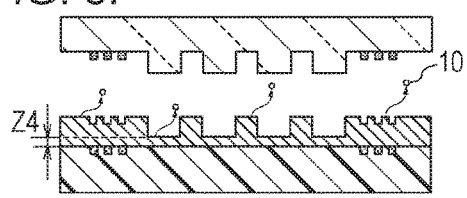
Figure 3L:
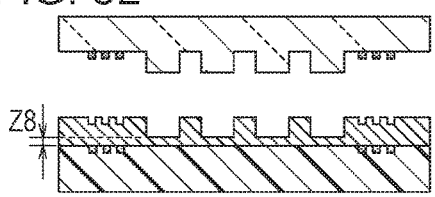

FIGS. 3F and 3L illustrate a state after the release.

As illustrated in FIG. 3F, the condensable gas 10 volatilizes, making the film of a mixture of the condensable gas 10 and the light-curable composition become thinner as a result of volume contraction. The film thickness of the light-curable composition in FIG. 3F is almost identical to that in FIG. 3I. The film thickness of the light-curable composition in FIG. 3C is therefore 40% or more greater than that of the light-curable composition in FIG. 3F.

The alignment, illustrated in FIGS. 3C and 3I, requires exponentially greater force with decreasing film thickness of the light-curable composition R between the mold M and the workpiece substrate W when the thickness of the light-curable composition R is small, in particular, 10 nm or less. This appears to be because the molecules of the light-curable composition R are structured.

In FIG. 3C, the 40% increase in the film thickness of the light-curable composition reduces the force required for the movement in the shear direction, thereby shortening the time required to make the amount of displacement Y1 a specified value or less, e.g., 15 nm or less. The length of this time for the correction of the amount of displacement Y1 can be 1.0 second or less.

As illustrated in FIGS. 3F and 3L, the residual film thickness values Z4 and Z8 of the finally produced light-cured material 12 are equal. However, the film thickness values Z1 to Z3 in the process in which a condensable gas is used, i.e., the film thickness of a mixture of the dissolved condensable gas 10 and the light-curable composition R, are 40% greater than the final film thickness values Z4 and Z8 and the film thickness values Z5 to Z7 in the process in which no condensable gas is used.

This lowers the force required to move the workpiece substrate W to reduce the amount of displacement Y1.

Figure 4:
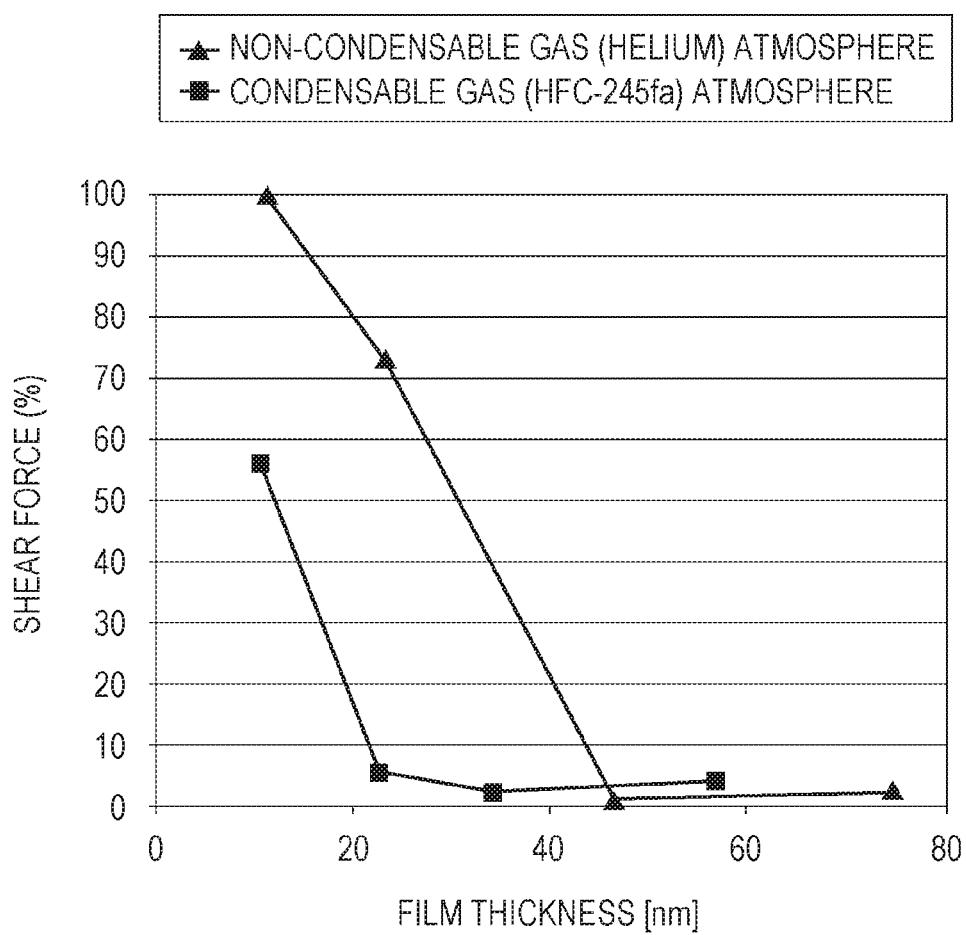
FIG. 4 presents experimental results obtained in an imprint method as an example of the invention and in a comparative example, illustrating the shear force during the alignment of a mold and a workpiece substrate.

As illustrated in FIG. 4, the inventors experimentally confirmed that the shear force upon the alignment of a mold and a workpiece substrate was smaller in a condensable gas (HFC-245fa) atmosphere than in a non-condensable gas (helium) atmosphere even when the film thickness of a light-curable composition was small (in particular, 40 nm or less).

In FIG. 4, the shear force measured when the film thickness of the light-curable composition was 15 nm is described as 100%.

An aspect of the invention provides an imprint method in which a condensable gas dissolved in a light-curable composition makes the film thickness of the light-curable composition during alignment 20% or more greater than that of the resulting light-cured composition so that the force required to move the mold and the light-curable composition apart from each other in the shear direction after contact should be reduced.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-133541, filed Jun. 26, 2013 and No. 2014-121911 filed Jun. 12, 2014, which are hereby incorporated by reference herein in their entirety.

REFERENCE SIGNS LIST

1 Nanoimprint apparatus
2 Light source
3 Alignment camera
4 Gas feeder
5 Light-curable composition applicator
6 Substrate stage
7 Cavity
8 Mold holder
9 Condensable-gas-containing gas
10 Dissolved condensable gas
11 Light
12 Light-cured material
13 Condensable-gas-free gas
AMM Alignment marks on the mold side
AMW Alignment marks on the workpiece side
W Workpiece substrate
M Mold

The invention claimed is:

1. An imprint method comprising:
placing a light-curable composition on a workpiece substrate;
bringing the light-curable composition and a mold into contact with each other in an atmosphere of a condensable gas;
aligning the mold and the workpiece substrate while the light-curable composition is in contact with both of the workpiece substrate and the mold;
irradiating the light-curable composition with light to obtain a light-cured composition; and
after the irradiation, separating the light-cured composition and the mold from each other, the condensable gas being a gas that condenses under a temperature condition that occurs during the contact and a pressure condition that occurs upon the light-curable composition penetrating into a space between the workpiece substrate and the mold or a depression in the mold;
wherein a film thickness of the light-curable composition during the alignment is 20% or more greater than a film thickness of the light-cured composition after the release and is 40 nm or less,
wherein the alignment is performed in a shear direction while the film thickness of the light-curable composition is increased by the dissolution of the condensable gas.

2. The imprint method according to claim 1, wherein the film thickness of the light-cured composition after the release is 20 nm or less.

3. The imprint method according to claim 1, wherein the film thickness of the light-cured composition after the release is 10 nm or less.

4. The imprint method according to claim 1, further comprising dissolving the condensable gas in the light-curable composition before the contact.

5. The imprint method according to claim 1, wherein the light-curable composition and the mold are brought into contact with each other in a mixed-gas atmosphere of the condensable gas and a non-condensable gas.

6. The imprint method according to claim 1, wherein the condensable gas is any one of pentafluoropropane, trichlorofluoromethane, and pentafluoroethyl methyl ether.

7. The imprint method according claim 6, wherein the condensable gas is 1,1,1,3,3-pentafluoropropane.

8. The imprint method according to claim 1, wherein the light-curable composition is placed on the workpiece substrate by any of ink jet, dip coating, and spin coating.

9. The imprint method according to claim 1, wherein the light-curable composition is acrylic resin.

10. The imprint method according to claim 1, wherein the mold and the workpiece substrate are aligned within 1.0 second.

11. The imprint method according to claim 1, further comprising aligning the light-curable composition and the mold before bringing the light-curable composition and the mold into contact with each other.

* * * * *